(12) United States Patent
Xu

(10) Patent No.: US 10,305,050 B2
(45) Date of Patent: May 28, 2019

(54) FLEXIBLE PANELS AND THE MANUFACTURING METHODS THEREOF

(71) Applicant: Wuhan China Star Optoelectronics Technology Co., Ltd., Wuhan, Hubei (CN)

(72) Inventor: Chao Xu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 113 days.

(21) Appl. No.: 15/327,625

(22) PCT Filed: Jan. 16, 2017

(86) PCT No.: PCT/CN2017/071228
§ 371 (c)(1),
(2) Date: Jan. 19, 2017

(87) PCT Pub. No.: WO2018/120313
PCT Pub. Date: Jul. 5, 2018

(65) Prior Publication Data
US 2018/0219164 A1    Aug. 2, 2018

(51) Int. Cl.
*H01L 51/00* (2006.01)
*C09J 7/25* (2018.01)
(Continued)

(52) U.S. Cl.
CPC .......... *H01L 51/0097* (2013.01); *B33Y 10/00* (2014.12); *C09J 5/00* (2013.01);
(Continued)

(58) Field of Classification Search
CPC .................. H01L 51/0097; H01L 51/003
See application file for complete search history.

(56) References Cited

U.S. PATENT DOCUMENTS 9,308,697 B2    4/2016  Ke et al.
2009/0244906 A1*  10/2009  Kim ................ G02F 1/133553
362/327
(Continued)

FOREIGN PATENT DOCUMENTS

CN       103325731 A     9/2013
CN       106098939 A    11/2016

*Primary Examiner* — Lex H Malsawma
*Assistant Examiner* — Xia L Cross
(74) *Attorney, Agent, or Firm* — Andrew C. Cheng

(57) ABSTRACT

The present disclosure relates to a flexible panel and the manufacturing method thereof. The method includes: coating photosensitive adhesive on a substrate to form a photosensitive layer; forming a scattering layer and an ultraviolet (UV) blocking layer on the photosensitive layer in sequence; forming a flexible substrate layer on the UV blocking layer; forming electronic components, lighting components, and an encapsulation layer on the flexible substrate layer in sequence; and irradiating the photosensitive layer from one side of the substrate by UV rays such that a peeling strength of the photosensitive layer being reduced, and the scattering layer being separated from the substrate to form the flexible panel. By configuring the photosensitive layer, the scattering layer, and the UV blocking layer on the substrate, the scattering layer may be easily separated from the substrate.

18 Claims, 4 Drawing Sheets

(51) Int. Cl.
  *C09J 7/35* (2018.01)
  *C09J 7/24* (2018.01)
  *C09J 5/06* (2006.01)
  *H01L 27/32* (2006.01)
  *H01L 51/52* (2006.01)
  *H01L 51/56* (2006.01)
  *C09J 5/00* (2006.01)
  *B33Y 10/00* (2015.01)
  *B05D 1/00* (2006.01)
  *B05D 3/06* (2006.01)

(52) U.S. Cl.
  CPC . C09J 5/06 (2013.01); C09J 7/24 (2018.01); C09J 7/25 (2018.01); C09J 7/35 (2018.01); H01L 27/3244 (2013.01); H01L 51/003 (2013.01); H01L 51/5253 (2013.01); H01L 51/5268 (2013.01); H01L 51/56 (2013.01); B05D 1/005 (2013.01); B05D 3/067 (2013.01); C09J 2203/322 (2013.01); C09J 2203/326 (2013.01); C09J 2205/302 (2013.01); C09J 2205/31 (2013.01); C09J 2433/006 (2013.01); C09J 2463/00 (2013.01); C09J 2479/086 (2013.01); C09J 2483/00 (2013.01); H01L 2227/323 (2013.01); H01L 2227/326 (2013.01); *H01L 2251/303* (2013.01); *H01L 2251/5338* (2013.01); *H01L 2251/5369* (2013.01); *Y02E 10/549* (2013.01)

(56) References Cited

U.S. PATENT DOCUMENTS

| | | | |
|---|---|---|---|
| 2013/0306231 A1* | 11/2013 | Tanaka | G02F 1/133305 156/247 |
| 2014/0027739 A1* | 1/2014 | van De Weijer | H01L 51/5256 257/40 |
| 2014/0166998 A1* | 6/2014 | Lee | H01L 27/323 257/40 |
| 2014/0192534 A1* | 7/2014 | Cho | F21V 5/002 362/290 |
| 2015/0021631 A1* | 1/2015 | Huh | H01L 27/1218 257/88 |
| 2015/0228927 A1* | 8/2015 | Kim | H01L 51/5203 257/40 |
| 2016/0155988 A1* | 6/2016 | Kuroki | H01L 51/0097 257/40 |
| 2017/0047558 A1* | 2/2017 | Lee | H01L 51/56 |
| 2017/0207402 A1 | 7/2017 | Cheng et al. | |
| 2018/0113244 A1* | 4/2018 | Vasylyev | G02B 6/0036 |

* cited by examiner

FLEXIBLE PANELS AND THE MANUFACTURING METHODS THEREOF

BACKGROUND OF THE INVENTION

1. Field of the Invention

The present disclosure relates to display technology, and more particularly to a flexible substrate and the manufacturing method thereof.

2. Discussion of the Related Art

Organic light-emitting diodes (OLEDs) have been widely used in the field of display technology due to the advantages, such as self-luminescence, wide viewing angle, high contrast, low power consumption and fast response speed, and thus have been gradually applied to our daily life. Compared with the traditional TFT-LCD, the biggest advantage of OLED is that the large-scale, ultra-thin flexible components can be prepared. However, flexible substrate is fragile to deformation, and is difficult to operate in the production process, which limits the production of flexible components.

Currently, the manufacturing method of an OLED flexible module is to bond the flexible substrate to a rigid substrate, and then separate the rigid substrate from the flexible substrate after preparing the OLED flexible module. However, since the rigid substrate and the flexible substrate have high adhesion and are tightly adhered, it is difficult to separate the two after the device is prepared, resulting in an increased defective ratio.

SUMMARY

The present disclosure relates to a flexible panel and the manufacturing method thereof to solve the issue of separating the rigid substrate and the flexible substrate as described above.

In one aspect, a manufacturing method of flexible panels includes: coating photosensitive adhesive on a substrate to form a photosensitive layer, the photosensitive adhesive being epoxy-terminated polysiloxane or silicone material; forming a scattering layer and an ultraviolet (UV) blocking layer on the photosensitive layer in sequence, the scattering layer being made by titanium dioxide; forming a flexible substrate layer on the UV blocking layer; forming electronic components, lighting components, and an encapsulation layer on the flexible substrate layer in sequence; and irradiating the photosensitive layer from one side of the substrate by UV rays such that a peeling strength of the photosensitive layer being reduced, and the scattering layer being separated from the substrate to form the flexible panel.

In another aspect, a manufacturing method of flexible panels includes: coating photosensitive adhesive on a substrate to form a photosensitive layer; forming a scattering layer and an ultraviolet (UV) blocking layer on the photosensitive layer in sequence; forming a flexible substrate layer on the UV blocking layer; forming electronic components, lighting components, and an encapsulation layer on the flexible substrate layer in sequence; and irradiating the photosensitive layer from one side of the substrate by UV rays such that a peeling strength of the photosensitive layer being reduced, and the scattering layer being separated from the substrate to form the flexible panel.

Wherein the step of forming the scattering layer and the UV blocking layer on the photosensitive layer in sequence further includes: applying a spin-coating process to form the scattering layer and the UV blocking layer on the photosensitive layer in sequence.

Wherein the step of forming the flexible substrate layer on the UV blocking layer further includes: applying a spraying process on the UV blocking layer to form the flexible substrate layer.

Wherein the flexible substrate is made by polyimide (PI) or polymethyl methacrylate (PMMA).

Wherein the photosensitive adhesive is epoxy-terminated polysiloxane or silicone material.

Wherein the scattering layer is made by titanium dioxide.

Wherein the UV blocking layer is made by transparent organic or inorganic materials.

Wherein the electronic component is a thin film transistor (TFT).

Wherein the lighting component is an organic light-emitting diodes (OLEDs).

In another aspect, a flexible panel made by above the manufacturing method.

Wherein the step of forming the scattering layer and the UV blocking layer on the photosensitive layer in sequence further includes: applying a spin-coating process to form the scattering layer and the UV blocking layer on the photosensitive layer in sequence.

Wherein the step of forming the flexible substrate layer on the UV blocking layer further includes: applying a spraying process on the UV blocking layer to form the flexible substrate layer.

Wherein the flexible substrate is made by polyimide (PI) or polymethyl methacrylate (PMMA).

Wherein the photosensitive adhesive is epoxy-terminated polysiloxane or silicone material.

Wherein the scattering layer is made by titanium dioxide.

Wherein the UV blocking layer is made by transparent organic or inorganic materials.

Wherein the electronic component is a thin film transistor (TFT).

Wherein the lighting component is an organic light-emitting diode (OLED).

In view of the above, the photosensitive layer, the scattering layer, and the UV blocking layer are formed on the substrate. The photosensitive layer is irradiated by the UV rays such that the adhesive forces and the peeling strength are lowered down such that the scattering layer may be easily stripped from the substrate. The manufacturing method is simple and easy to operate. In addition, the yield rate of the flexible panel may be enhanced.

BRIEF DESCRIPTION OF THE DRAWINGS

Embodiments of the invention will now be described more fully hereinafter with reference to the accompanying drawings, in which embodiments of the invention are shown. Apparently, the accompanying drawings are only some embodiments of the claimed invention. Those of ordinary skill can derive other drawings from these drawings without creative efforts.

DETAILED DESCRIPTION OF THE EMBODIMENTS

Embodiments of the invention will now be described more fully hereinafter with reference to the accompanying drawings, in which embodiments of the invention are shown.

Figure 1:
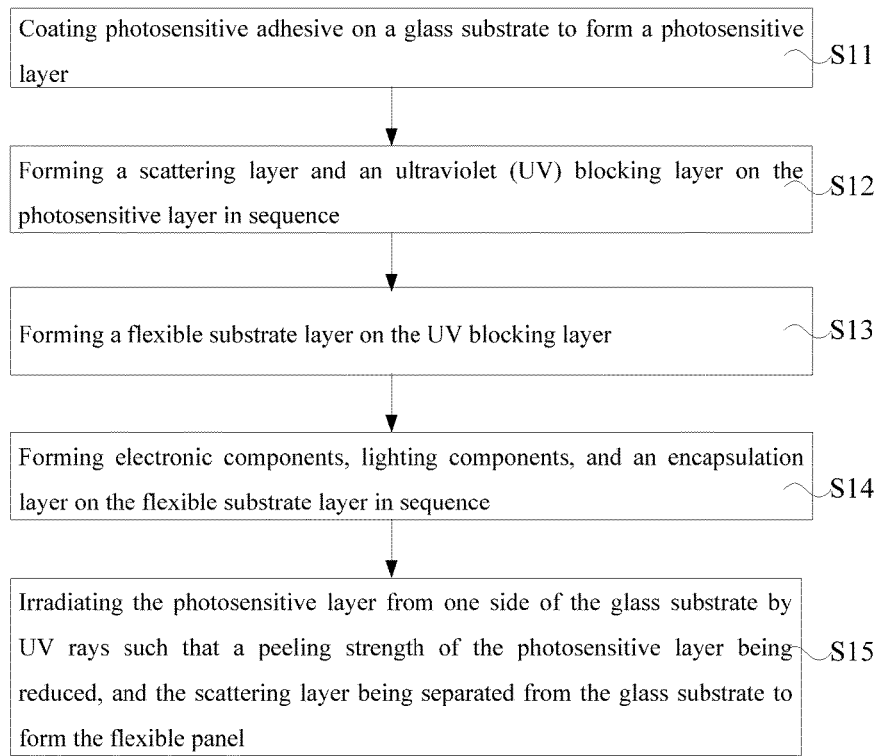
FIG. 1 is a flowchart illustrating the manufacturing method of the flexible panel in accordance with a first embodiment.
Figure 2:
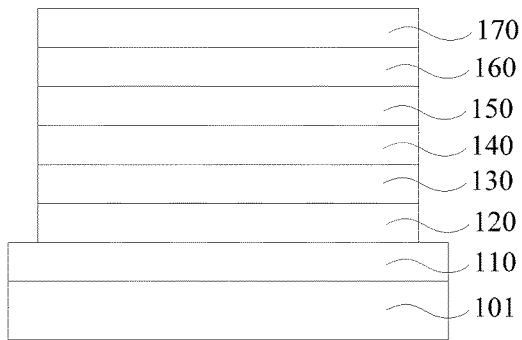
FIG. 2 is a schematic view showing the unseparated flexible panel in accordance with the first embodiment.

FIG. 1 is a flowchart illustrating the manufacturing method of the flexible panel in accordance with a first embodiment. FIG. 2 is a schematic view showing the unseparated flexible panel in accordance with the first embodiment. In the embodiment, a photosensitive, a scattering layer, and an ultraviolet blocking layer are formed on the substrate. The photosensitive layer is irradiated with ultraviolet light from the substrate side to lower the peeling strength of the photosensitive layer so that the scattering layer can be separated from the substrate easily. The method includes the following steps.

In step S11, coating photosensitive adhesive on a substrate to form a photosensitive layer.

As shown in FIG. 2, the substrate 101 is arranged on a substrate platform (not shown). The substrate 101 is cleaned and then coated with the photosensitive adhesive on a surface of the substrate 101 to form a photosensitive layer 110. A thickness of the photosensitive layer 110 is in a range from 10 to 1000 μm, and the thickness of the photosensitive layer 110 is in a range from 50 to 500 μm.

Photosensitive adhesive is a kind of adhesive, which can be cured by UV irradiation. It can be used as adhesive, also as paint, coating, Ultraviolet rays (UV) curing adhesive, ink and the like. UV rays are invisible to naked eye, which occupy a section of electromagnetic radiation other than visible light. The wavelength range of the UV rays is in a range from 110 to 400 nm. Photo-sensitive adhesive curing principle relates to that the UV curing materials in the photo-initiator (or photo-sensitizer) absorb ultraviolet radiation generated after being irradiated by the UV rays so as to generate active free radicals or cations, which initiates monomer polymerization, cross-linking chemical reaction, and the adhesive transits from liquid into solid. In this embodiment, the material of the photosensitive adhesive material is an epoxy-terminated polysiloxane or a silicone material.

In step S12, forming a scattering layer and an ultraviolet (UV) blocking layer on the photosensitive layer in sequence.

Specifically, applying a spin-coating process to form the scattering layer 120 and the UV blocking layer 130 on the photosensitive layer 110 in sequence. A dimension of the photosensitive layer 110 is greater than the dimension of the scattering layer 120, and the scattering layer 120 is arranged in a central portion of the photosensitive layer 110.

The spin-coating process is the short name of the spin-coating method, which is commonly used in OLEDs. The main equipment is a homogenizer. The spin coating method includes three steps: batching, high-speed rotation, and volatile-film formation. The thickness of the film is controlled by controlling the time of batching, the rotational speed, the droplet volume, and the concentration and viscosity of the solution.

The scattering layer 120 may be made by inorganic materials for blocking the UV rays and for extracting visible lights. In one embodiment, the scattering layer 120 may be made by TiO2.

Titanium dioxide can absorb ultraviolet radiation, but also reflection, scattering of ultraviolet rays. In addition, the visible lights may pass through the titanium dioxide. Thus, the titanium dioxide is of a shielding type of UV protective agent having superior performance. The anti-ultraviolet ability of titanium dioxide is due to its high refractive and high optical activity. Normally, light propagates along a straight line, and refraction and reflection occur at different surfaces of the medium, and the total reflection light cannot be emitted. The scattering layer 120 of the present embodiment may include titanium dioxide nano-particles of different shapes and sizes. When the light beams irradiate on the surface of the titanium dioxide nanoparticles, the light beams are reflected in all directions and refraction so as to help the light beams to emit out. Similarly, the light beams that cannot emit out may scatter on the titanium dioxide nano-particles above the scattering layer 120, and then are emitted out such that the scattering layer 120 can realize the optical extraction function. The range of the scattering layer 120 is in a range from 10 to 1000 nm. Further, the thickness of the scattering layer 120 is in a range from 250 to 500 nm.

The UV blocking layer 130 may be made by transparent organic or inorganic materials, wherein the organic materials may be PVA, and the inorganic material may be the titanium dioxide, which is the same with the material of the scattering layer 120. In one aspect, the UV blocking layer 130 reduces the impact caused by the UV rays toward the photosensitive layer 110 in the manufacturing process of the electronic components. In another aspect, when the photosensitive layer 110 is stripped from the flexible panel by the UV rays' irradiation, the UV blocking layer 130 prevents the organic lighting materials from being affected by the UV rays. The thickness of the UV blocking layer 130 is in a range from 10 to 1000 nm. Further, the thickness of the UV blocking layer 130 is in a range from 250 to 500 nm.

In step S13, forming a flexible substrate layer on the UV blocking layer.

Specifically, applying a spraying process on the UV blocking layer 130 to form the flexible substrate layer 140. The spraying process relates to adopting a spray gun or dish-type atomizer to distribute the material by means of pressure or centrifugal force, the spraying process may be classified into air-spraying, airless spraying, electrostatic spraying, and various derivations of the above-described basic spraying forms, and are not limited thereto.

The flexible substrate layer 140 may be made by polyethylene (PE), polypropylene (PP), polystyrene (PS), polyethylene terephthalate (PET), polyethylene terephthalate (PM) or polyimide (PI), wherein the material of the flexible substrate layer 140 is preferably polymethyl methacrylate (PMMA), polyimide (PI), or polyimide (PI). Among them, polyimide (PI) is one of the most excellent organic polymer materials with high temperature resistance of over 400 Celsius degrees, long-term use temperature range from −200 to 300 Celsius, no obvious melting point, excellent mechanical properties, high insulation Performance, making it the most commonly used materials for making flexible substrates. The thickness of the flexible substrate layer 140 is in the range of 10 to 1000 μm, and the thickness of the ultraviolet blocking layer 130 is in the range of 250 to 500 μm.

In step S14, forming electronic components, lighting components, and an encapsulation layer on the flexible substrate layer in sequence.

The electronic components 150, the light-emitting component 160, and the encapsulation layer 170 are formed on the flexible substrate layer 140 in sequence. The electronic component 150 is a thin film transistor (TFT) for controlling and driving the sub-pixels in the light-emitting component 160 to emit lights. The light-emitting component 160 may be OLED having a thin and transparent ITO connected with a positive end of the power supply, and another metal cathode to form a sandwich structure. The structure further includes a through-hole transmission layer (HTL), an emitting light layer (EL), and an electron transmission layer (ETL).

When the power is supplied to the appropriate voltage, the positive hole and the cathode charge are combined in the light emitting layer (EL), which produces light and produces primary colors of red, green and blue depending on the formulation thereof. OLEDs is characterized by self-luminescence, and thus conventional backlight may be omitted. The visibility and the brightness are high, followed by low voltage requirements and high power efficiency, coupled with fast response, light weight, In addition, other advantages also includes thin thickness, simple structure, and low cost. The manufacturing method of the lighting component 160 is the same as that of the conventional production method, and will not be described in detail.

The encapsulation layer 170 relates to thin-film encapsulation, which may be one of or a combination of a several materials including glass, an organic thin film, an inorganic thin film and a metal foil. Thin-film encapsulation technology prevents the OLED material from exposing in the external environment so as to protect the OLED materials. The OLED has been focused in the thin and light, and large-scale lighting technology. The manufacturing method of the encapsulation layer 170 of the present disclosure is the same as that of the conventional production method, and will not be described in detail.

In step S15, irradiating the photosensitive layer from one side of the substrate by UV rays such that the peeling strength of the photosensitive layer is reduced, which results in that the scattering layer is separated from the substrate to form the flexible panel.

In view of the above, the photosensitive layer 110, the scattering layer 120, and the UV blocking layer 130 are formed on the substrate 101. The photosensitive layer 110 is irradiated by the UV rays such that the adhesive forces and the peeling strength are lowered down such that the scattering layer 120 may be easily stripped from the substrate 101. The manufacturing method is simple and easy to operate. In addition, the yield rate of the flexible panel may be enhanced.

Figure 3:
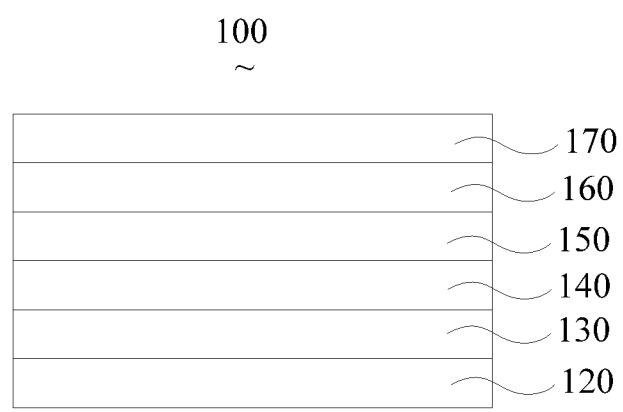
FIG. 3 is a schematic view of the flexible panel in accordance with the first embodiment.

FIG. 3 is a schematic view of the flexible panel in accordance with the first embodiment. As shown in FIG. 3, the photosensitive layer, as shown in FIG. 1, is irradiated by UV rays from one side of the substrate, and the peeling strength of the photosensitive layer is lowered down such that the scattering layer 120 is separated from the substrate to form the array substrate 100.

The array substrate 100 is made by the above method. The array substrate 100 includes the scattering layer 120, the UV blocking layer 130, the flexible substrate layer 140, the electronic component 150, the lighting component 160, and the encapsulation layer 170.

Wherein the array substrate 100 may be made by the above method.

Figure 4:
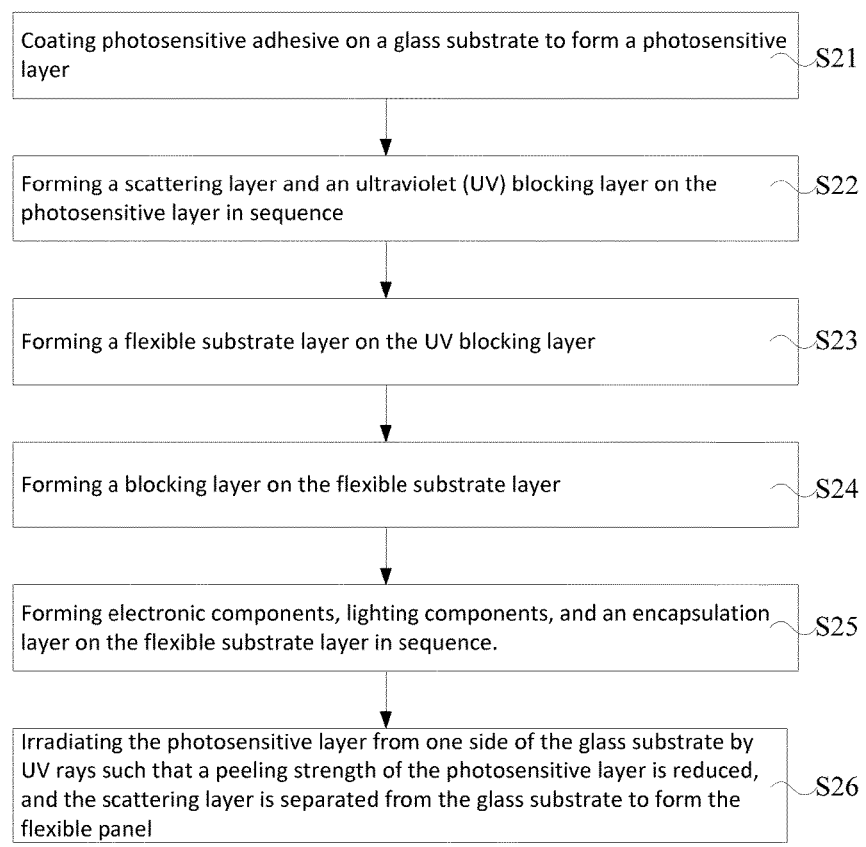
FIG. 4 is a flowchart illustrating the manufacturing method of the flexible panel in accordance with a second embodiment.
Figure 5:
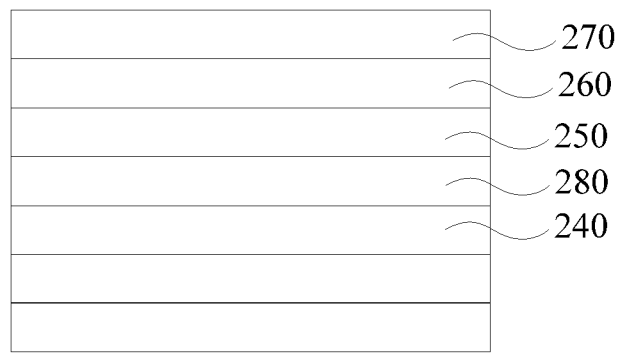
FIG. 5 is a schematic view of the flexible panel in accordance with the second embodiment.

FIG. 4 is a flowchart illustrating the manufacturing method of the flexible panel in accordance with a second embodiment. FIG. 5 is a schematic view of the flexible panel in accordance with the second embodiment. In the embodiment, the blocking layer is formed on the flexible substrate, and the electronic components, the lighting components, and the encapsulation layer are formed on the flexible substrate layer in sequence. The method includes the following steps.

In step S21, coating photosensitive adhesive on a substrate to form a photosensitive layer.

In step S22, forming a scattering layer and an ultraviolet (UV) blocking layer on the photosensitive layer in sequence.

In step S23, forming a flexible substrate layer on the UV blocking layer.

In step S24, forming a blocking layer on the flexible substrate layer.

In step S25, forming electronic components, lighting components, and an encapsulation layer on the flexible substrate layer in sequence.

In step S26, irradiating the photosensitive layer from one side of the substrate by UV rays such that a peeling strength of the photosensitive layer is reduced, and the scattering layer is separated from the substrate to form the flexible panel.

FIG. 5 is a schematic view of the flexible panel in accordance with the second embodiment.

As shown in FIG. 5, the method of the second embodiment is substantially the same with that in the second embodiment. Also, the structure of the array substrate 200 formed by the manufacturing method is also the same. The difference resides in that the step S24 is increased, and the step S24 is configured to be before the step S25. In step S24, the blocking layer 280 is formed on the flexible substrate layer 240. In step S25, the electronic components 250, the lighting components 260, and the encapsulation layer 270 are formed on the flexible substrate layer in sequence.

Specifically, a blocking layer 280 is formed on the flexible substrate layer 240 by a chemical vapor deposition method (CVD) in which a vapor containing a gaseous reactant or a liquid reactant constituting a thin film element and a reaction, and other gases are introduced into the reaction chamber. The chemical reaction on the surface of the substrate forms the thin film. With respect to large-scale integrated circuits (ICs), many thin films are prepared by CVD method. After the CVD treatment, the surface treatment film adhesion is increased by about 30%, which can prevent high-strength steel from being bent, stretched and other scratched. The material of the blocking layer 280 is a silicon nitride material (SiNx), which is a super-hard substance. The silicon nitride itself has lubricity and is resistant to wear and has an oxidation resistance at a high temperature.

The blocking layer 280 may block vapors and oxygen so as to protect the electronic components 250 and the optical components 260.

In view of the above, the photosensitive layer, the scattering layer, and the UV blocking layer are formed on the substrate. The photosensitive layer is irradiated by the UV rays such that the adhesive forces and the peeling strength are lowered down such that the scattering layer may be easily stripped from the substrate. The manufacturing method is simple and easy to operate. In addition, the yield rate of the flexible panel may be enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of flexible panels, comprising:
   coating photosensitive adhesive on a substrate to form a photosensitive layer, the photosensitive adhesive being epoxy-terminated polysiloxane;
   forming a scattering layer and an ultraviolet (UV) blocking layer on the photosensitive layer in sequence, the scattering layer being made by titanium dioxide;
   forming a flexible substrate layer on the UV blocking layer;
   forming electronic components, lighting components, and an encapsulation layer on the flexible substrate layer in sequence; and
   irradiating the photosensitive layer from one side of the substrate by UV rays such that a peeling strength of the photosensitive layer being reduced, and the scattering layer being separated from the substrate to form the flexible panel,
   wherein the scattering layer comprises titanium dioxide nano-particles of different shapes and sizes.

2. A manufacturing method of flexible panels, comprising:
   coating photosensitive adhesive on a substrate to form a photosensitive layer;
   forming a scattering layer and an ultraviolet (UV) blocking layer on the photosensitive layer in sequence;
   forming a flexible substrate layer on the UV blocking layer;
   forming electronic components, lighting components, and an encapsulation layer on the flexible substrate layer in sequence; and
   irradiating the photosensitive layer from one side of the substrate by UV rays such that a peeling strength of the photosensitive layer being reduced, and the scattering layer being separated from the substrate to form the flexible panel,
   wherein the scattering layer comprises titanium dioxide nano-particles of different shapes and sizes.

3. The manufacturing method as claimed in claim 2, wherein the step of forming the scattering layer and the UV blocking layer on the photosensitive layer in sequence further comprises:
   applying a spin-coating process to form the scattering layer and the UV blocking layer on the photosensitive layer in sequence.

4. The manufacturing method as claimed in claim 2, wherein the step of forming the flexible substrate layer on the UV blocking layer further comprises:
   applying a spraying process on the UV blocking layer to form the flexible substrate layer.

5. The manufacturing method as claimed in claim 4, wherein the flexible substrate is made by polyimide (PI) or polymethyl methacrylate (PMMA).

6. The manufacturing method as claimed in claim 2, wherein the photosensitive adhesive is epoxy-terminated polysiloxane or silicone material.

7. The manufacturing method as claimed in claim 2, wherein the UV blocking layer is made by transparent organic or inorganic materials.

8. The manufacturing method as claimed in claim 2, wherein the electronic component is a thin film transistor (TFT).

9. The manufacturing method as claimed in claim 2, wherein the lighting component is an organic light-emitting diode (OLED).

10. The manufacturing method as claimed in claim 2, wherein a dimension of the photosensitive layer is greater than the dimension of the scattering layer, and the scattering layer is arranged in a central portion of the photosensitive layer.

11. The manufacturing method as claimed in claim 2, wherein a thickness of the scattering layer is in a range from 250 to 500 nm.

12. The manufacturing method as claimed in claim 2, wherein the scattering layer is capable of blocking the UV rays and extracting visible lights.

13. A flexible panel made by the manufacturing method as claimed in claim 2.

14. The flexible panel as claimed in claim 13, wherein the flexible substrate is made by polyimide (PI) or polymethyl methacrylate (PMMA).

15. The flexible panel as claimed in claim 13, wherein the photosensitive adhesive is epoxy-terminated polysiloxane or silicone material.

16. The flexible panel as claimed in claim 13, wherein the UV blocking layer is made by transparent organic or inorganic materials.

17. The flexible panel as claimed in claim 13, wherein the electronic component is a thin film transistor (TFT).

18. The flexible panel as claimed in claim 13, wherein the lighting component is an organic light-emitting diode (OLED).

* * * * *